United States Patent [19]

Sugawa

[11] Patent Number: 5,343,199

[45] Date of Patent: Aug. 30, 1994

[54] RESISTOR STRING CIRCUIT FOR USE IN D/A CONVERTER OR A/D CONVERTER

[75] Inventor: Naoki Sugawa, Yokohama, Japan

[73] Assignee: Kabushiki Kaisha Toshiba, Kawasaki, Japan

[21] Appl. No.: 10,200

[22] Filed: Jan. 28, 1993

[30] Foreign Application Priority Data

Jan. 29, 1992 [JP] Japan .................. 4-013906

[51] Int. Cl.$^5$ ............................................. H03M 1/36
[52] U.S. Cl. .................................. 341/159; 341/144; 341/118
[58] Field of Search ............... 341/118, 126, 144, 155, 341/159

[56] References Cited

U.S. PATENT DOCUMENTS

| | | | |
|---|---|---|---|
| 4,229,729 | 10/1980 | Devendorf et al. ................ | 341/159 |
| 4,496,935 | 1/1985 | Inoue et al. ........................ | 341/118 |
| 4,814,767 | 3/1989 | Fernandes et al. ................. | 341/158 |
| 4,924,225 | 5/1990 | Dingwall et al. ................... | 341/118 |
| 4,983,973 | 1/1991 | Lewyn ................................ | 341/138 |

*Primary Examiner*—Marc S. Hoff
*Attorney, Agent, or Firm*—Banner, Birch, McKie and Beckett

[57] ABSTRACT

A resistor string circuit, which is for use in a D/A converter or an A/D converter, has a first resistor string 11 and a second resistor string 12. The first resistor string 11 is connected between a ground potential point Vss and a reference potential point Vref and has resistor elements R11 to R18 connected in series to one another. Likewise, the second resistor string 12 is connected between a ground potential point Vss and a reference potential point Vref and has resistor elements R21 to R28 connected in series to one another. The ground potential point Vss of the second resistor string 12 is located in the vicinity of the reference potential point Vref of the first resistor string 11, and the reference potential point Vref of the second resistor string 12 is located in the vicinity of the ground potential point Vss. Those nodes of the first and second resistor strings 11 and 12 which are the same in potential level are connected by means of wiring layers 14, 17 and 20. Therefore, the first and second resistor strings 11 and 12 are symmetrical to each other, and the non-linear error arising from the manufacturing errors of the resistor elements is prevented from increasing from the ground potential points Vss to the reference potential points Vss.

5 Claims, 10 Drawing Sheets

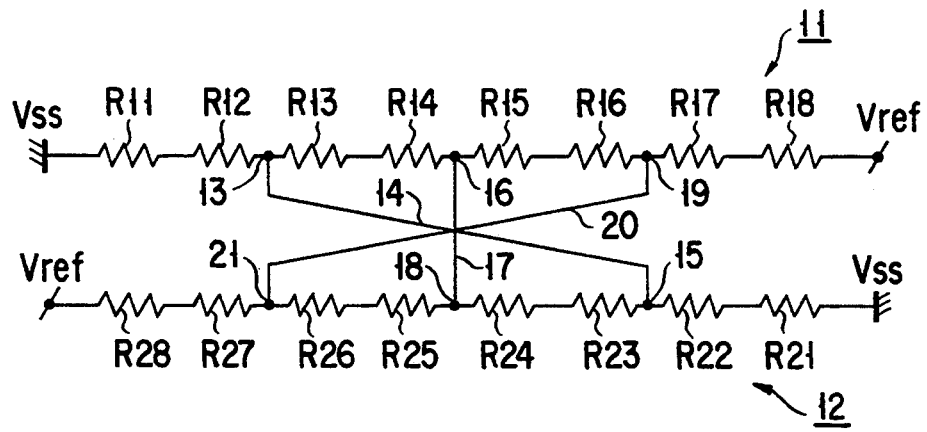
F I G. 9
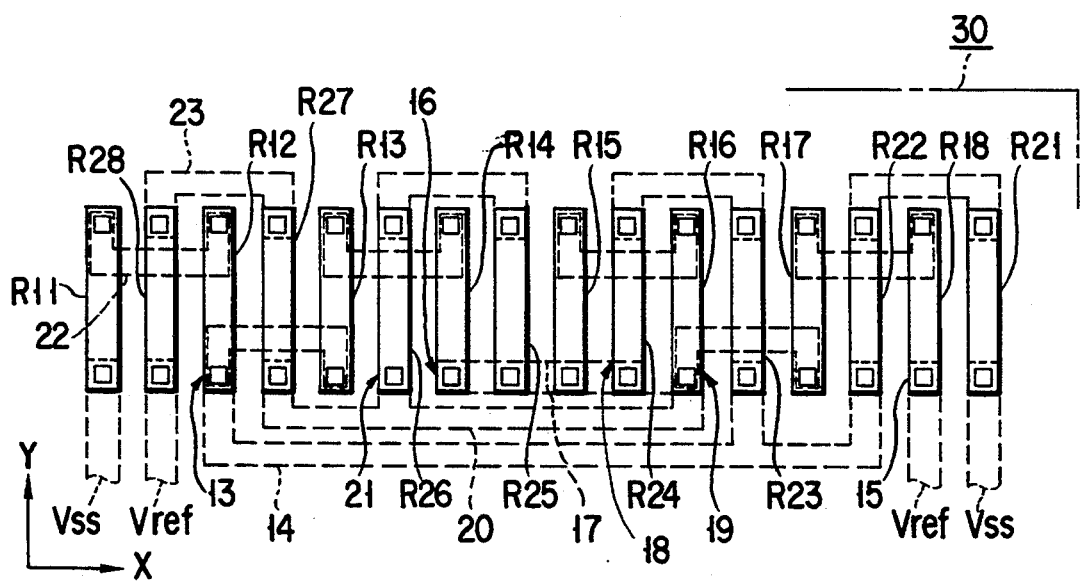
F I G. 10

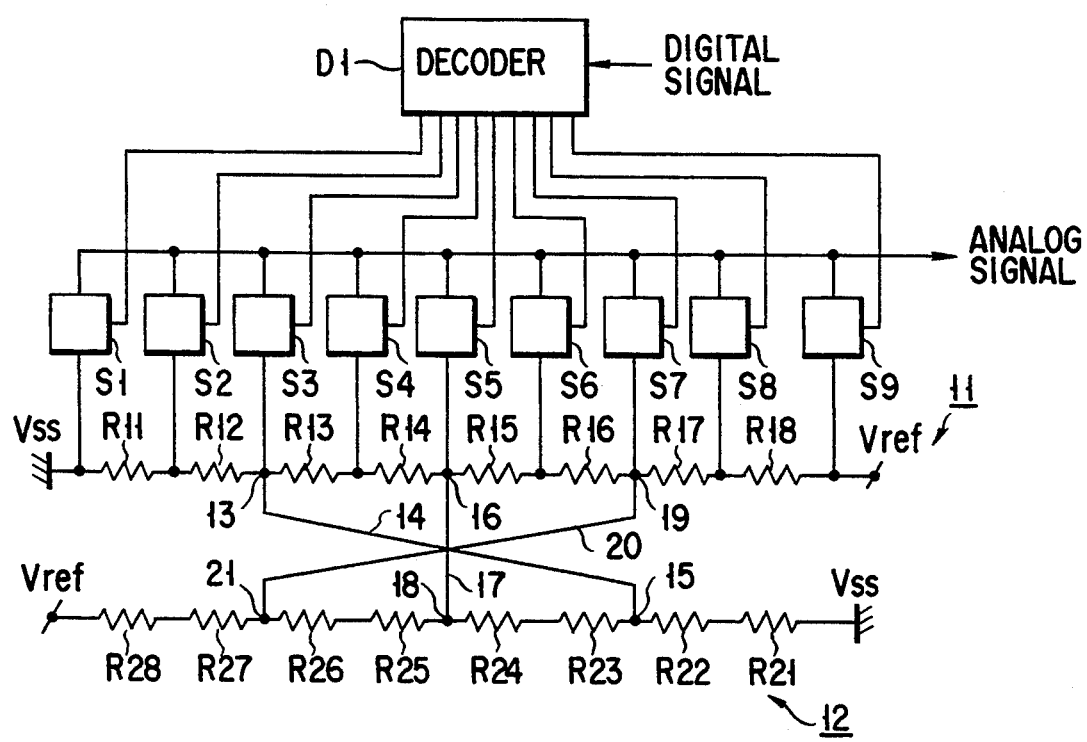
F I G. 11
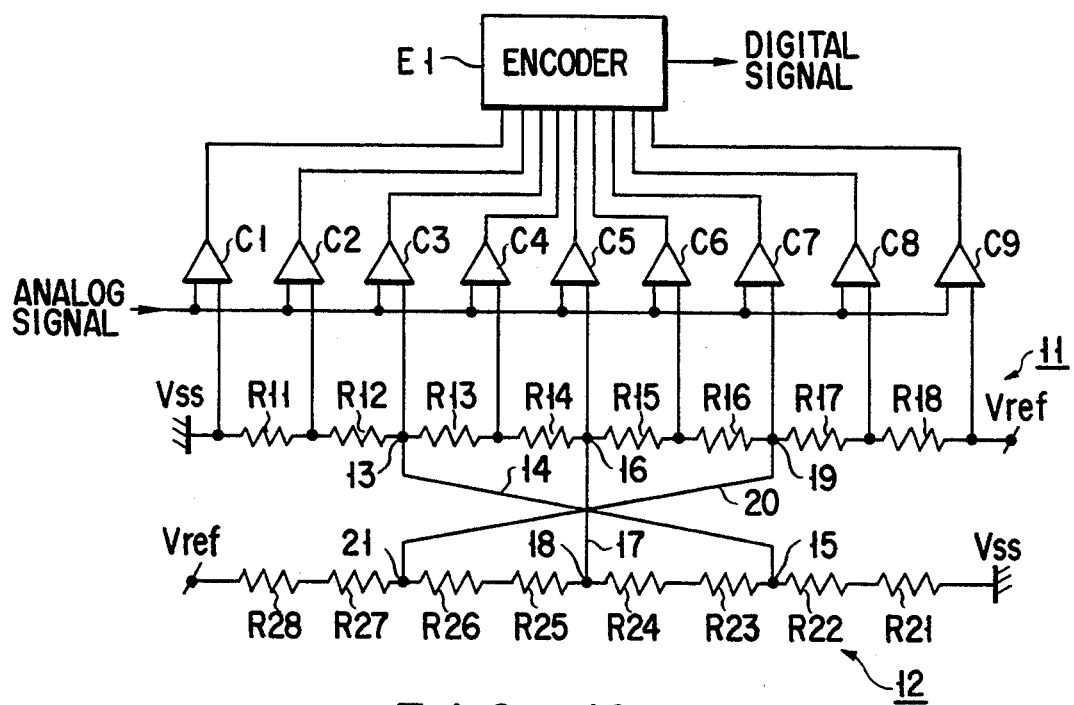
F I G. 12

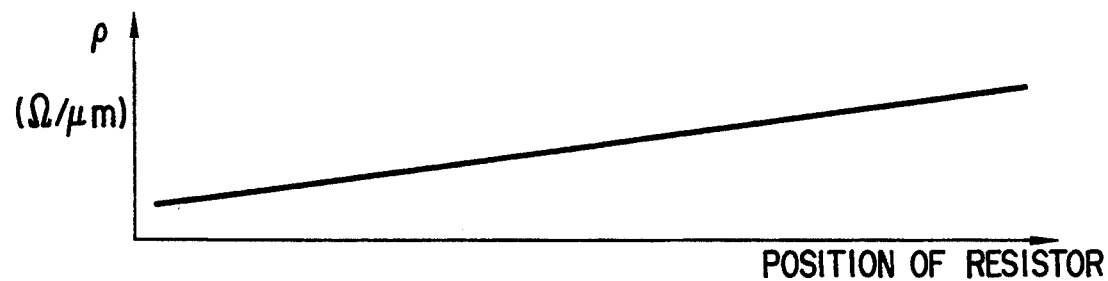
F I G. 13
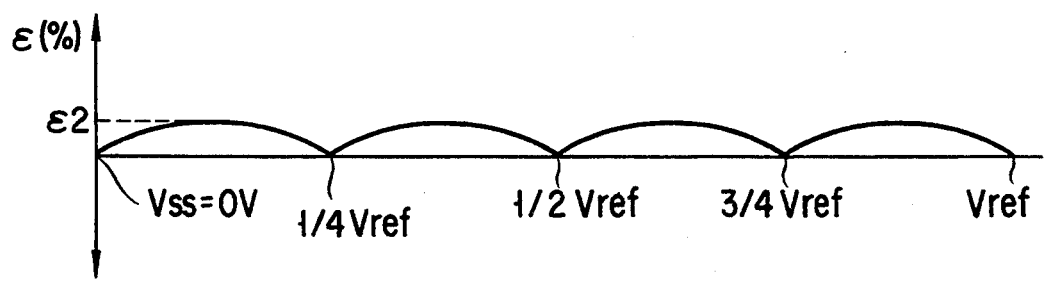
F I G. 14

|  | CONVENTIONAL CASES | | PRESENT INVENTION |
|---|---|---|---|
|  | FIG. 1 ($\varepsilon 0$) | FIG. 5 ($\varepsilon 1$) | FIG. 9 ($\varepsilon 2$) |
| MAXIMUM NON-LINEAR ERROR (%) | 0.143 | 0.083 | 0.009 |

FIG. 15

|  | CONVENTIONAL CASES | | PRESENT INVENTION |
|---|---|---|---|
|  | FIG. 1 | FIG. 5 | FIG. 9 |
| TOTAL HARMONIC DISTORTION (THD) (dB) | −58.1 | −58.9 | −84.2 |

FIG. 16

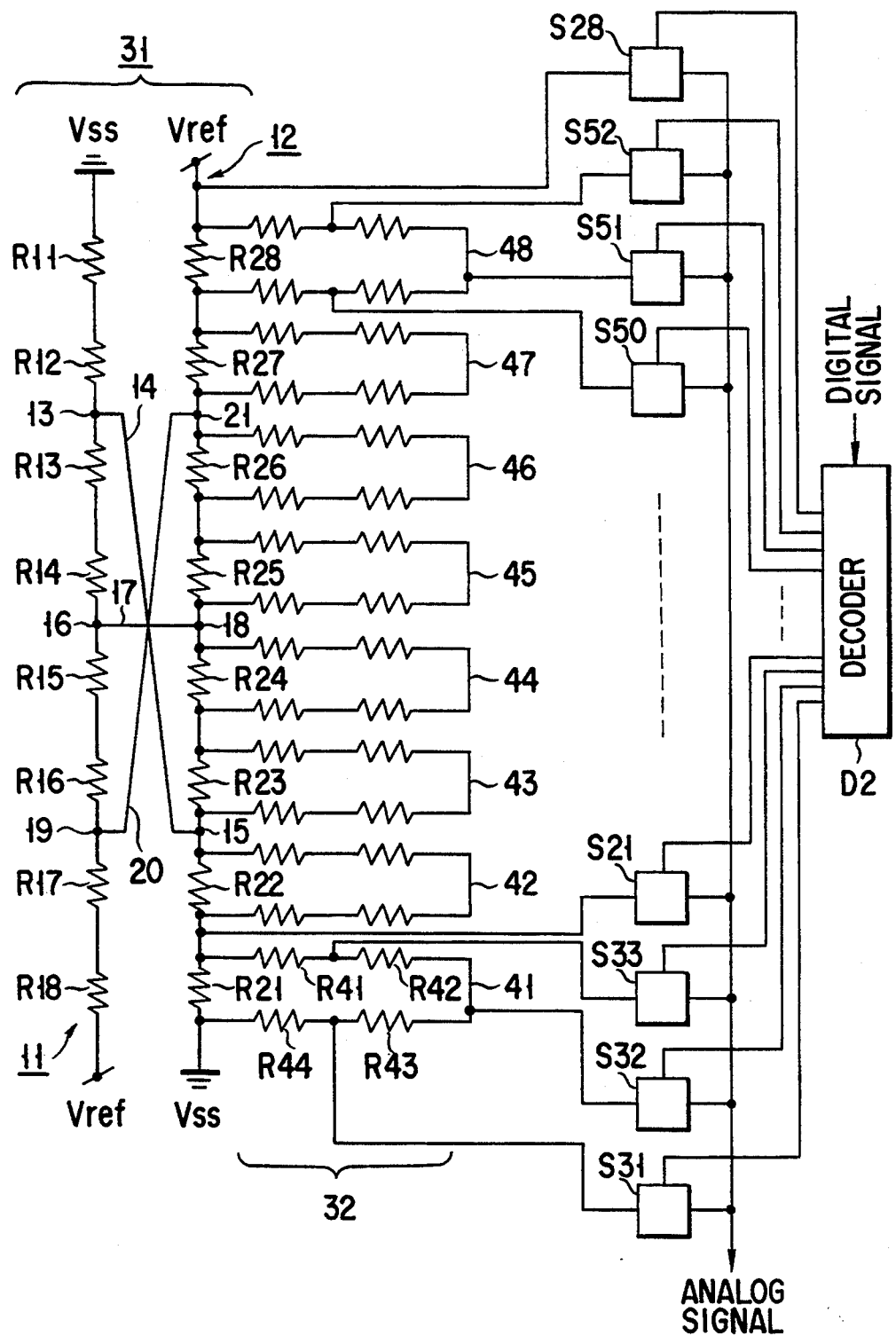
F I G. 18

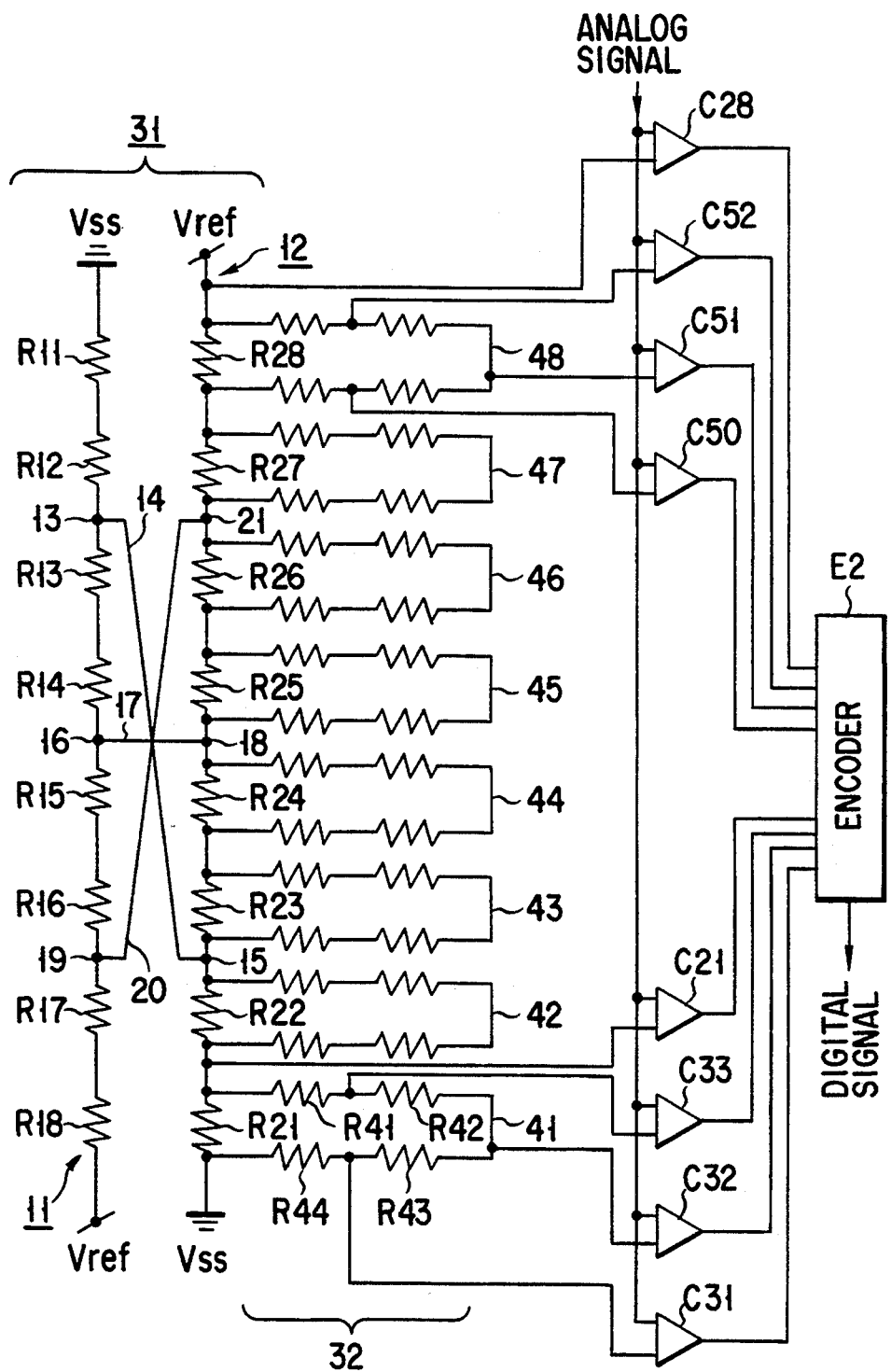
F I G. 19

RESISTOR STRING CIRCUIT FOR USE IN D/A CONVERTER OR A/D CONVERTER

BACKGROUND OF THE INVENTION

1. Field of the Invention

The present invention relates to a resistor string circuit for use in a high-precision D/A converter or an A/D converter.

2. Description of the Related Art

An example of a resistor string circuit of this type is shown in "Non-Linear Error Analysis And Evaluation of Resistor String Type A/D Converter", Treatise Collection of the Electrical Communication Society of Japan, vol. J67-C, No. 12, PP 941-948, 1984-12.

A resistor string type D/A converter is generally used as an internal circuit of a D/A converter device or an A/D converter device. The precision of the resistor string type D/A converter is dependent on the manufacturing errors of the resistor elements. In other words, if the resistance of one resistor element differs from that of another due to the manufacturing errors, the resistor string produces a non-linear error. This being so, the precision of a conventional resistor string type D/A converter is not more than 8–9 bits, and it is difficult to realize a high-precision D/A converter or A/D converter of 10 bits or more by using the conventional resistor string type D/A converter.

FIG. 1 is an equivalent circuit diagram showing an example of a 3-bit resistor string circuit disclosed in the document noted above. As is shown in FIG. 1, resistor elements R1 to R8 are connected in series between a ground potential point Vss and a reference potential point Vref.

FIG. 2 shows an example of a circuit pattern corresponding to the resistor string circuit of FIG. 1. In the resistor segment circuit shown in FIG. 2, resistor elements R1 to R8 are arranged in such a manner as to extend in the Y-direction, to thereby shorten the X-direction dimension of the circuit pattern. Resistor elements R1 to R8 are connected together by means of metal wiring layers (e.g., aluminum wiring layers Al) extending in the X-direction.

FIG. 3 is a graph showing how a deviation of a planar component per X-direction unit length is produced in the circuit pattern shown in FIG. 2 due to the manufacturing error. In the graph of FIG. 3, the position of a resistor is plotted against the abscissa, while the resistance $\rho(\Omega/\mu m)$ per unit length is plotted against the ordinate.

FIG. 4 is a graph showing how a non-linear error $\epsilon$ occurs in the case where the circuit pattern in FIG. 2 has such X-direction resistance deviations as are depicted in FIG. 3 (the deviation of a planar component in the X-direction is neglected in FIG. 4). In FIG. 4, the potential divided by the resistor elements is plotted against the abscissa, while the non-linear error $\epsilon$ is plotted against the ordinate. In the case shown in FIG. 4, the maximum error is $\epsilon 0$.

FIGS. 5 and 6 show another conventional resistor string circuit. FIG. 5 is an equivalent circuit diagram, and FIG. 6 is a plan view of the circuit pattern.

The resistor string circuit shown in FIGS. 5 and 6 is turned back at the portion between resistor elements R4 and R5, and a ground potential point Vss and a reference potential point Vref are located adjacent to each other.

In the case of the circuit pattern shown in FIGS. 5 and 6, the maximum value $\epsilon 1$ of the non-linear error is lower than that $\epsilon 0$ of the case shown in FIGS. 1 and 2 ($\epsilon 1 < \epsilon 0$), as is shown in FIG. 8, although the deviation of a planar resistance component per X-direction unit length remains the same, as is shown in FIG. 7. However, maximum value $\epsilon 1$ is not more than about $\frac{1}{2}$ of maximum value $\epsilon 0$. Therefore, even where a D/A converter including the resistor string circuit shown in FIGS. 5 and 6 is employed, it is difficult to realize a high-precision D/A or A/D converter of 10 bits or more.

As described above, with the conventional resistor string circuits, the non-linear error arising from the manufacturing error cannot be reduced to a satisfactory extent, and it is difficult to realize a high-precision D/A or A/D converter device by employing a D/A converter including either one of the above conventional resistor string circuits.

SUMMARY OF THE INVENTION

An object of the present invention is to provide a resistor string circuit in which the non-linear error due to the manufacturing error can be reduced sufficiently and with which a high-precision D/A or A/D converter device of 10 bits or more can be realized.

To achieve this object, the present invention provides a resistor string circuit which comprises:

a first resistor string including a plurality of resistor elements connected in series, the first resistor string having one end connected to a first power supply and another end connected to a second power supply;

a second resistor string arranged adjacent to the first resistor string and including a plurality of resistor elements connected in series, the second resistor string having one end connected to the second power supply and another end connected to the first power supply; and at least one wiring means for connecting those nodes of the first and second resistor strings which are equal in potential level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a circuit diagram illustrating the first embodiment of the present invention;

FIG. 10 is a plan view showing an example of a pattern realizing the circuit shown in FIG. 9;

FIG. 11 is a circuit diagram showing the case where the circuit in FIG. 9 is applied to a D/A converter;

FIG. 12 is a circuit diagram showing the case where the circuit in FIG. 9 is applied to an A/D converter;

FIG. 13 is a graph showing one characteristic of the circuit shown in FIG. 9;

FIG. 14 is a graph showing another characteristic of the circuit shown in FIG. 9;

FIG. 15 shows maximum non-linear errors of the present invention and conventional circuits;

FIG. 16 shows total harmonic distortions of the present invention and conventional circuits;

FIG. 18 is a circuit diagram showing the case where the circuit in FIG. 17 is applied to a D/A converter; and FIG. 19 is a circuit diagram showing the case where the circuit in FIG. 17 is applied to an A/D converter.

DETAILED DESCRIPTION OF THE PREFERRED EMBODIMENTS

Figure 1:
FIG. 1 is a circuit diagram showing one conventional resistor string circuit.
Figure 2:
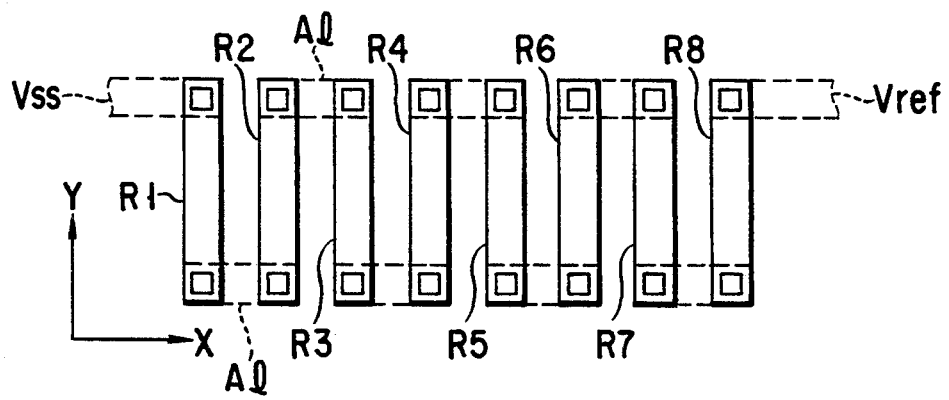
FIG. 2 is a plan view showing an example of a pattern realizing the circuit shown in FIG. 1.
Figure 3:
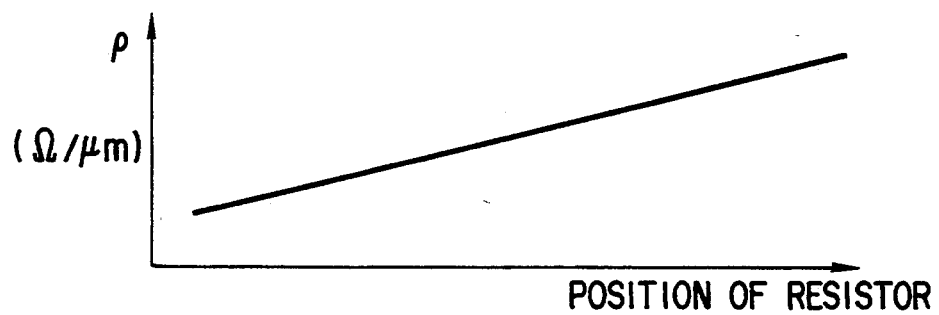
FIG. 3 is a graph showing one characteristic of the circuit shown in FIG. 1.

Embodiments of the present invention will now be described with reference to the accompanying drawings.

FIG. 9 shows a 3-bit resistor string circuit according to one embodiment of the present invention.

As is shown in FIG. 9, the resistor string circuit is made up of first and second resistor strings 11 and 12. In the first resistor string 11, resistor elements R11 to R18 connected in series are arranged between a ground potential point Vss and a reference potential point Vref. The second resistor string 12 is arranged in the opposite direction to that of the first resistor string 11. To be more specific, the ground potential point Vss of the second resistor string 12 is located in the vicinity of the reference potential point Vref of the first resistor string 11, and the reference potential point Vref of the second resistor string 12 is located in the vicinity of the ground potential point Vss of the first resistor string 11. In the second resistor string 12, resistor elements R21 to R28 connected in series are arranged between the ground potential point Vss and the reference potential point Vref.

The first and second resistor strings 11 and 12 are connected together at those nodes which are equal in potential level. More specifically, node 13 (potential: $\frac{1}{4}$Vref) located between resistor elements R12 and R13 is connected to node 15 (potential: $\frac{1}{4}$Vref) located between resistor elements R22 and R23, by means of a wiring layer 14. Node 16 (potential: $\frac{1}{2}$Vref) located between resistor elements R14 and R15 is connected to node 18 (potential: $\frac{1}{2}$Vref) located between resistor elements R24 and R25, by means of a wiring layer 17. Node 19 (potential: $\frac{3}{4}$Vref) located between resistor elements R16 and R17 is connected to node 21 (potential: $\frac{3}{4}$Vref) located between resistor elements R26 and R27, by means of a wiring layer 20. With this circuit configuration, the first and second resistor strings 11 and 12 are symmetric to each other.

FIG. 10 shows a pattern corresponding to the circuit in FIG. 9. In FIG. 10, the same reference symbols as used in FIG. 9 denote the corresponding elements or points.

Referring to FIG. 10, resistor elements R11–R18 of the first resistor string 11 and resistor elements R28–R21 of the second resistor string 12 are alternately arranged in the X-axis direction and extend in the Y-axis direction. Resistor elements R11 to R18 are connected together by means of wiring layers 22, and resistor elements R28 to R21 are connected together by means of wiring layers 23. Node 13 of the first resistor string 11 is connected to node 15 of the second resistor string 12 by means of the wiring layer 14. Likewise, node 16 is connected to node 18 by means of the wiring layer 17, and node 19 is connected to node 21 by means of the wiring layer 20. The resistor elements R11–R18 and R28–R21 may be diffusion resistors which are formed by diffusing impurities within the interior of a semiconductor substrate 30. Alternatively, they may be polycrystalline silicon resistors.

FIG. 11 shows the case where the resistor string circuit in FIG. 9 is applied to a D/A converter. In FIG. 11, the same reference symbols as used in FIG. 9 denote the corresponding elements or points. Referring to FIG. 11, that node of the first resistor string 11 which is located between the ground potential point Vss and resistor element R11 is connected to the first terminal of switch circuit S1; the node located between resistor elements R11 and R12, to the first terminal of switch circuit S2; the node located between resistor elements R12 and 13, to the first terminal of switch circuit S3; the node located between resistor elements R13 and R14, to the first terminal of switch circuit S4; the node located between resistor elements R14 and R15, to the first terminal of switch circuit S5; the node located between resistor elements R15 and R16, to the first terminal of switch circuit S6; the node located between resistor elements R16 and R17, to the first terminal of switch circuit S7; the node located between resistor elements R17 and R18, to the first terminal of switch circuit S8; and the node located between resistor element R18 and the reference potential point Vref, to the first terminal of switch circuits S9. The second terminals of the switch circuits S1 to S9 are connected in common. A decoder D1 has an input terminal for receiving a digital signal, and a plurality of output terminals respectively connected to the control signal input terminals of the switch circuits S1 to S9. The decoder D1 decodes the digital signal supplied thereto and selects one of the switch circuits S1 to S9 in accordance with an output obtained by the decoding. Accordingly, the selected switch circuit outputs an analog signal corresponding to the digital signal supplied to the decoder.

FIG. 12 shows the case where the resistor string circuit in FIG. 9 is applied to an A/D converter. In FIG. 12, the same reference symbols as used in FIG. 9 denote the corresponding elements or points. Referring to FIG. 12, that node of the first resistor string 11 which is located between the ground potential point Vss and resistor element R11 is connected to the first input terminal of comparator C1; the node located between resistor elements R11 and R12, to the first input terminal of comparator C2; the node located between resistor elements R12 and R13, to the first input terminal of comparator C3; the node located between resistor elements R13 and R14, to the first input terminal of comparator C4; the node located between resistor elements R14 and R15, to the first input terminal of comparator C5; the node located between resistor elements R15 and R16, to the first input terminal of comparator C6; the node located between resistor elements R16 and R17, to the first input terminal of comparator C7; the node located between resistor elements R17 and R18, to the first input terminal of comparator C8; and the node located between resistor element R18 and the reference potential point Vref, to the first input terminal of comparator C9. The comparators C1 to C9 receive analog signals at the second input terminals thereof. The output terminals of the comparators C1 to C9 are connected to the respective input terminals of an encoder El. Each of the comparators C1 to C9 compares the voltage of the analog signal supplied thereto with the voltage generated by the corresponding one of the resistor elements, and outputs a high-level signal or a low-level signal in accordance with the comparison. The encoder E1 encodes the output signals of the comparators C1 to C9 and outputs a digital signal.

FIG. 13 shows how the circuit in FIGS. 9 and 10 exhibits resistance $\rho(\Omega/\mu m)$ per unit length in the X-axis direction, and FIG. 14 shows the relationships between the non-linear error $\epsilon$ of the circuit of FIGS. 9 and 10 and the resistor-divided potential.

In the embodiment shown in FIG. 9, the first and second resistor strings 11 and 12 are arranged symmetric to each other. Therefore, even if manufacturing deviations exist in the X-axis direction, the non-linear error $\epsilon$ at the ¼Vref potential points connected together by the wiring layer 14, the non-linear error $\epsilon$ at the ½Vref potential points connected together by the wiring layer 17, and the non-linear error $\epsilon$ at the ¾Vref potential points connected together by the wiring layer 20 are all zero, as is shown in FIG. 14. In addition, the maximum non-linear error $\epsilon 2$ of the embodiment is far lower than those $\epsilon 0$ and $\epsilon 1$ of the conventional circuits shown in FIGS. 4 and 8. Accordingly, the embodiment can greatly decrease the non-linear error.

Figure 5:
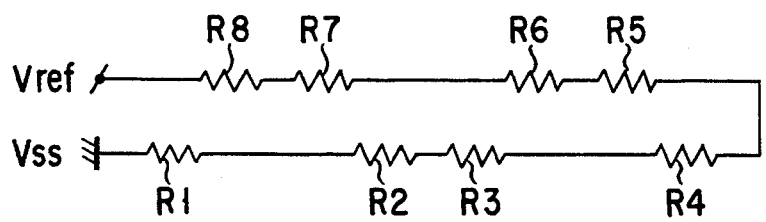
FIG. 5 is a circuit diagram showing another conventional resistor string circuit.
Figure 6:
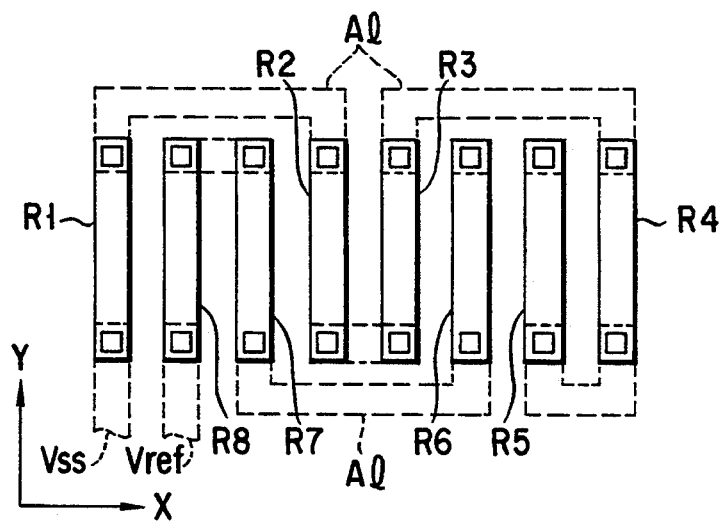
FIG. 6 is a plan view showing an example of a pattern realizing the circuit shown in FIG. 5.
Figure 7:
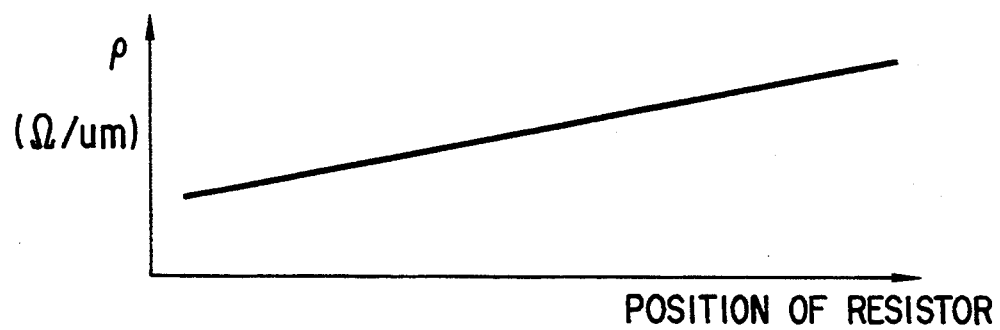
FIG. 7 is a graph showing one characteristic of the circuit shown in FIG. 5.

FIG. 15 shows maximum non-linear errors $\epsilon$ which are calculated with respect to the circuits shown in FIGS. 1, 5 and 9 on the assumption that the resistance deviation in the X-axis direction is 1%.

The above embodiment of the present invention employs three wiring layers each connecting the two nodes of the same potential level. Due to these three wiring layers, the maximum non-linear error $\epsilon$ can be reduced remarkably. That is, $\epsilon 2/\epsilon 0 = 1/16$, or $\epsilon 0/\epsilon 1 = 1/9$.

Figure 4:
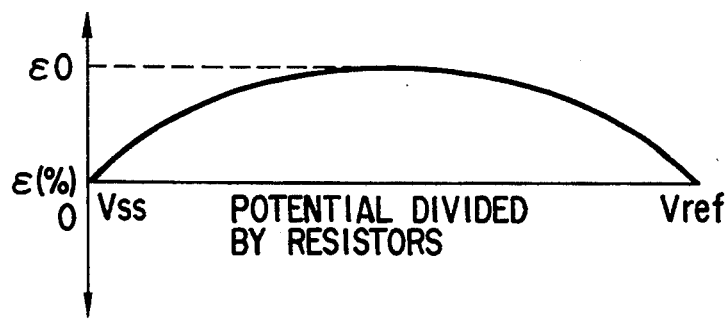
FIG. 4 is a graph showing another characteristic of the circuit shown in FIG. 1.
Figure 8:
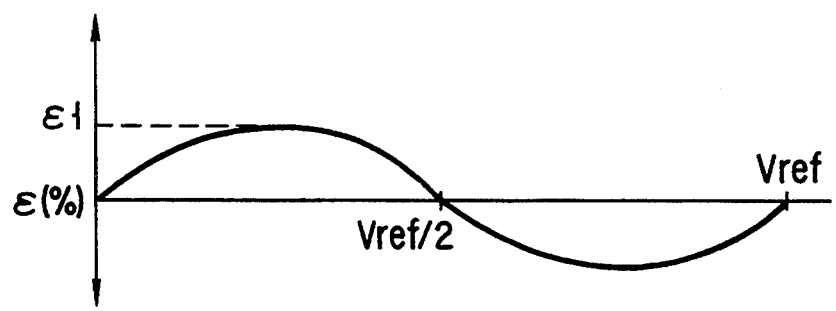
FIG. 8 is a graph showing another characteristic of the circuit shown in FIG. 5.

FIG. 16 shows how total harmonic distortions (THD) with reference to sinusoidal wave signals are caused by the non-linear errors. The total harmonic distortions are calculated with respect to the A/D converters respectively employing the resistor string circuits shown in FIGS. 1, 5 and 9. The total harmonic distortions are calculated on the assumption that the resistance deviation in the X-axis direction is 1%, and represent the A/D conversion characteristics involving such non-linear errors as are shown in FIGS. 4, 8 and 14.

Where the resistor string circuit shown in FIG. 9 is employed, the total harmonic distortion is $-84.2$ dB. As is apparent from FIG. 16, the improvement of the total harmonic distortion is 26.1 dB with reference to the case where the resistor string circuit shown in FIG. 1 is employed, and is 25.3 dB with reference to the case where the resistor string circuit shown in FIG. 5 is employed.

where a D/A converter and an A/D converter are fabricated employing the conventional resistor string circuits, the precision of about 9 bits is the limit, because of the resistance deviations arising from the manufacturing errors. However, where the resistance string circuit shown in FIG. 9 is employed, the maximum non-linear error $\epsilon 2$ is 0.009 (%) and the total harmonic distortion (THD) is $-80$ dB or more, on the assumption that the resistance variation in the X-axis direction is 1%. Therefore, the improvement of the total harmonic resistance is $-65$ dB with reference to the conventional cases. Accordingly, an A/D converter and a D/A converter which are as precise as 10 bits or more can be realized. In addition, since the circuit arrangement according to the embodiment is simple, the pattern is easy to design.

In the embodiment mentioned above, three wiring layers are employed to connect those nodes of the first and second resistor strings 11 and 12 which are equal in potential level. However, the number of wiring layers is not limited to three. As long as the first and second resistor strings 11 and 12 are symmetrical, only one wiring layer may be employed. Alternatively, two, or four or more wiring layers may be employed.

Figure 17:
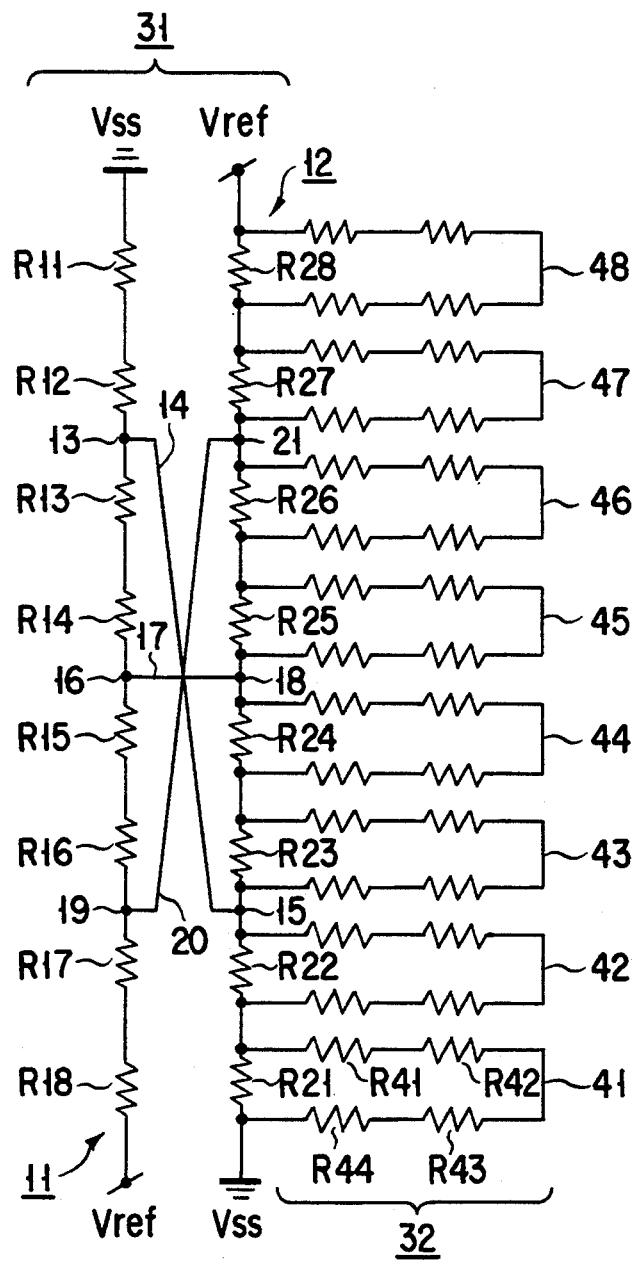
FIG. 17 is a circuit diagram illustrating the second embodiment of the present invention.

FIG. 17 shows the second embodiment of the present invention. The second embodiment is directed to a resistor string circuit suitable for fabricating a multi-bit D/A converter. In the second embodiment, the potentials corresponding to the upper three bits of the multi-bits are generated by resistor strings 31, and the structure of the resistor strings 31 is similar to that of the resistor strings employed in the embodiment shown in FIG. 9. In FIG. 17, therefore, the same reference numerals as used in FIG. 9 are used to denote the corresponding elements or points.

In the second embodiment, the potentials corresponding to the lower 2 bits are generated by a resistor string 32. This resistor string is made up of resistor strings 41–49 which are respectively connected in parallel to resistor elements R21–R28 of the upper-bit resistor string 31. Each of the resistor strings 41–49 has four resistor elements R41–R44. As in the first embodiment, the resistor elements R21 to R28 and the resistor elements R41 to R44 are formed by diffusion resistors or polycrystalline silicon resistors.

FIG. 18 shows the case where the resistor string circuit shown in FIG. 17 is applied to a D/A converter. In FIG. 18, the same reference numerals as used in FIG. 17 are used to denote the corresponding elements or points. Referring to FIG. 18, that node of the second resistor string 12 which is located between resistor elements 21 and 22 is connected to the first terminal of switch circuit S21; the node located between resistor elements 22 and 23, to the first terminal of switch circuit S22; the node located between resistor elements 23 and 24, to the first terminal of switch circuit S23; the node located between resistor elements 24 and 25, to the first terminal of switch circuit S24; the node located between resistor elements 25 and 26, to the first terminal of switch circuit S25; the node located between resistor elements 26 and 27, to the first terminal of switch circuit S26; the node located between resistor elements 27 and 28, to the first terminal of switch circuit S27; and the node located between resistor element 28 and the reference potential point Vref, to the first terminal of switch circuit S28. In resistor string 41, the node located between resistor elements R43 and R44 is connected to the first terminal of switch circuit S31; the node located between resistor elements R43 and R42, to the first terminal of switch circuit S32; and the node located between resistor elements R42 and R41, to the first terminal of switch circuit S33. In each of the remaining resistor strings 42-48, the nodes are connected to the respective switch circuits S34-S54 in a similar manner. The second terminals of switch circuits S21-S28 and S31-S54 are connected in common. A decoder D2 has an input terminal for receiving a digital signal, and a plurality of output terminals respectively connected to the control signal input terminals of switch circuits S21-S28 and S31-S54. The decoder D2 decodes the digital signal supplied thereto and selects one of the switch circuits S21-S28 and S31-S54 in accordance with an output obtained by the decoding. Accordingly, the selected switch circuit outputs an analog signal corresponding to the digital signal supplied to the decoder.

FIG. 19 shows the case where the resistor string circuit shown in FIG. 17 is applied to an A/D converter. In FIG. 19, the same reference symbols as used in FIG. 17 denote the corresponding elements or points. Referring to FIG. 19, that node of the second resistor string 12 which is located between resistor elements R21 and R22 is connected to one input terminal of comparator C21; the node located between resistor elements R22 and R23, to one input terminal of comparator C22; the node located between resistor elements R23 and R24, to one input terminal of comparator C23; the node located between resistor elements R24 and R25, to one input terminal of comparator C24; the node located between resistor elements R25 and R26, to one input terminal of comparator C25; the node located between resistor elements R26 and R27, to one input terminal of comparator C26; the node located between resistor elements R27 and R28, to one input terminal of comparator C27; and the node between resistor elements R28 and the reference potential point Vref, to one input terminal of comparator C28. In resistor string 41, the node located between resistor elements R43 and R44 is connected to one input terminal of comparator C31; the node located between resistor elements R43 and R42, to one input terminal of switch circuit C32; and the node located between resistor elements R42 and R41, to one input terminal of comparator C33. In each of the remaining resistor strings 42-48, the nodes are connected to the input terminals of the respective comparators C34-C54 in a similar manner. At the other input terminals, comparators C21-C28 and C31-C54 are supplied with analog signals. The output terminals of the comparators C21-C28 and C31-C54 are connected to the respective input terminals of an encoder E2. Each of the comparators C21-C28 and C31-C54 compares the voltage of the analog signal supplied thereto with the voltage generated by the corresponding one of the resistor elements R21-R28 and the resistor elements R41-R44 of resistor strings 41-48, and outputs either a high-level signal or a low-level signal in accordance with the comparison. The encoder E2 encodes the output signals of the comparators C21-C28 and C31-C54, and outputs a digital signal.

The second embodiment is advantageous in that the non-linear error can be reduced even if the number of bits is large. Since the second embodiment enables precision which is as high as that of the embodiment shown in FIG. 9, the precision of a D/A converter or an A/D converter can be enhanced, accordingly.

In the second embodiment, resistor strings 41-48 are added only to that resistor string 12 which corresponds to the upper bits. However, resistor strings 41-48 may be added to that resistor string 11 which corresponds to the lower bits as well. In addition, the number of wiring layers to be employed may be arbitrary.

The embodiments described above are merely examples of the present invention. The present invention may be modified in various manners when reduced to practice, without departing from the spirit and scope of the invention.

What is claimed is:

1. A resistor string circuit comprising:
   a first resistor string including a plurality of resistor elements connected in series, said first resistor string having one end connected to a first power supply and another end connected to a second power supply;
   a second resistor string arranged adjacent to the first resistor string and including a plurality of resistor elements connected in series, said second resistor string having one end connected to the second power supply and another end connected to the first power supply; and
   at least one wiring means for connecting those nodes of the first and second resistor strings which are equal in potential level.

2. A circuit according to claim 1, wherein the resistor elements of the first and second resistor strings are formed of polycrystalline silicon.

3. A circuit according to claim 1, wherein the resistor elements of the first and second resistor strings are formed by diffusion resistors which are obtained by diffusing impurities in a semiconductor substrate.

4. A D/A converter comprising:
   a first resistor string including a plurality of resistor elements connected in series, said first resistor string having one end connected to a first power supply and another end connected to a second power supply;
   a second resistor string arranged adjacent to the first resistor string and including a plurality of resistor elements connected in series, said second resistor string having one end connected to the second power supply and another end connected to the first power supply;
   at least one wiring means for connecting those nodes of the first and second resistor strings which are equal in potential level;
   a plurality of third resistor strings each including a plurality of resistor elements connected in series, each of the third resistor strings being connected in parallel to a corresponding one of the resistor elements of the second resistor string;
   decoder means, having an input terminal and a plurality of output terminals, for decoding a digital signal supplied to the input terminal and for outputting a decoded signal from the output terminals; and
   a plurality of switch means each having an input terminal, an output terminal, and a control signal input terminal, said input terminals of the switch means being connected to nodes of the resistor elements of the second and third resistor strings, said output terminals of the switch means being connected in common, said control signal input terminals of the switch means being connected to the output terminals of the decoder means, respectively, said switch means producing an analog voltage generated by the second and third resistor strings in accordance with the decoded signal output from the decoder means.

5. An A/D converter comprising:
a first resistor string including a plurality of resistor elements connected in series, said first resistor string having one end connected to a first power supply and another end connected to a second power supply;
a second resistor string arranged adjacent to the first resistor string and including a plurality of resistor elements connected in series, said second resistor string having one end connected to the second power supply and another end connected to the first power supply;
at least one wiring means for connecting those nodes of the first and second resistor strings which are equal in potential level;
a plurality of third resistor strings each including a plurality of resistor elements connected in series, each of the third resistor strings being connected in parallel to a corresponding one of the resistor elements of the second resistor string;
a plurality of comparator means each having a first input terminal, a second input terminal, and an output terminal, said first input terminals of the comparator means being connected to nodes of the resistor elements of the second and third resistor strings, said second input terminals of the comparator means being supplied with analog signals, each of said comparator means comparing a voltage generated by the second and third resistor strings with an analog-signal voltage and outputting a binary signal from the output terminal thereof; and
encoder means having a plurality of input terminals and an output terminal, said input terminals of the encoder means being connected to the output terminals of the comparator means, respectively, said encoder means encoding binary signals supplied thereto from the comparator means and outputting a digital signal from the output terminal thereof.

* * * * *